(12) United States Patent
Ishimoto

(10) Patent No.: US 8,732,385 B2
(45) Date of Patent: May 20, 2014

(54) NON-VOLATILE MEMORY, CONTROLLER CONTROLLING NEXT ACCESS

(75) Inventor: Takeshi Ishimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/797,954

(22) Filed: May 9, 2007

(65) Prior Publication Data
US 2008/0002469 A1  Jan. 3, 2008

(30) Foreign Application Priority Data
Jun. 12, 2006  (JP) ................. 2006-162275

(51) Int. Cl.
G06F 12/02 (2006.01)

(52) U.S. Cl.
CPC .... *G06F 12/0246* (2013.01); *G06F 2212/7203* (2013.01); *G06F 2212/7207* (2013.01)
USPC ..... 711/103; 711/156; 711/213; 711/E12.007

(58) Field of Classification Search
USPC ................................. 711/103, 156
See application file for complete search history.

(56) References Cited

U.S. PATENT DOCUMENTS

| 5,537,573 | A | * | 7/1996 | Ware et al. | 711/137 |
| 5,630,093 | A | * | 5/1997 | Holzhammer et al. | 711/115 |
| 5,781,756 | A | * | 7/1998 | Hung | 711/103 |
| 5,806,070 | A | * | 9/1998 | Norman et al. | 711/103 |
| 5,822,788 | A | * | 10/1998 | Kahn et al. | 711/213 |
| 6,182,207 | B1 | * | 1/2001 | Poivre et al. | 712/225 |
| 6,499,083 | B1 | * | 12/2002 | Hamlin | 711/112 |
| 6,507,894 | B1 | * | 1/2003 | Hoshi | 711/137 |
| 7,142,691 | B2 | * | 11/2006 | Levy | 382/100 |
| 7,225,297 | B2 | * | 5/2007 | Heil | 711/137 |
| 7,386,690 | B2 | * | 6/2008 | Alexander et al. | 711/156 |
| 2002/0007434 | A1 | * | 1/2002 | Campardo | 711/103 |
| 2004/0205301 | A1 | * | 10/2004 | Hara et al. | 711/137 |
| 2004/0225846 | A1 | * | 11/2004 | Guo | 711/156 |
| 2005/0144421 | A1 | * | 6/2005 | In et al. | 711/203 |
| 2006/0268609 | A1 | * | 11/2006 | Kim et al. | 365/185.11 |

(Continued)

FOREIGN PATENT DOCUMENTS

| JP | 54-054536 A | 4/1979 |
| JP | 09-180477 A | 7/1997 |

(Continued)

OTHER PUBLICATIONS

McCorkle, Eric. "Programmable Bus/Memory Controllers in Modern Computer Architecture." Mar. 2005. 43rd ACM Southeast Conference. ACM.*

(Continued)

*Primary Examiner* — Nathan Sadler
(74) *Attorney, Agent, or Firm* — Rader, Fishman & Grauer PLLC

(57) ABSTRACT

Disclosed herein is a non-volatile memory, including: a memory cell array to be accessed with data including a data portion and a specific field as a unit of access; a buffer configured to hold the access-unit data read from the memory cell array or the access-unit data to be written to the memory cell array; and a control circuit configured to control access to the memory cell array in accordance with a specified address, a command, and data in the specific field of the access-unit data held in the buffer.

11 Claims, 14 Drawing Sheets

(56) References Cited

U.S. PATENT DOCUMENTS

2007/0276990 A1* 11/2007 Mosek et al. .................. 711/103
2009/0168530 A1* 7/2009 Yamamura et al. ...... 365/185.13
2013/0138867 A1* 5/2013 Craft et al. .................... 711/103

FOREIGN PATENT DOCUMENTS

| JP | 11-110236 A | 4/1999 |
| JP | 11-282765 A | 10/1999 |
| JP | 2006-163302 A | 6/2000 |
| JP | 2000-285001 A | 10/2000 |
| JP | 2001-319485 A | 11/2001 |
| JP | 2002-288988 A | 10/2002 |
| JP | 2003-015929 A | 1/2003 |
| JP | 2004-039055 A | 2/2004 |
| JP | 2004-240660 A | 8/2004 |
| JP | 2006-099940 A | 4/2006 |

OTHER PUBLICATIONS

Kendall, Richard and Vincent Freeh. "The Modify-on-Access File System: An Extensible Linux File System." 1999. http://www.cse.nd.edu/~ssr/papers/linc99/linc99.ps.*

Hennessy, John L. and David A. Patterson. Computer Architecture: A Quantitative Approach. 2003. Morgan Kaufmann Publishers. Third Edition. pp. 130-133.*

Christopher J. Hughes and Sarita Adve. "Memory-Side Prefetching for Linked Data Structures." May 2001. Department of Computer Science, University of Illinois at Urbana-Champaign. Technical Report UIUCDCS-R-2001-2221.*

* cited by examiner

FIG. 4

| Logical Address (LA) | Physical Address (PA) |
|---|---|
| 0 | 0 |
| 1 | 1 |
| 2 | 2 |
| 3 | 4 |
| 4 | 6 |
| 5 | 7 |
| 6 | 100 |
| 7 | 104 |
| 8 | 102 |
| ⋮ | ⋮ |
| 100 | 3 |
| 101 | 5 |
| ⋮ | ⋮ |
| 200 | 101 |
| 201 | 103 |
| ⋮ | ⋮ |
|  |  |

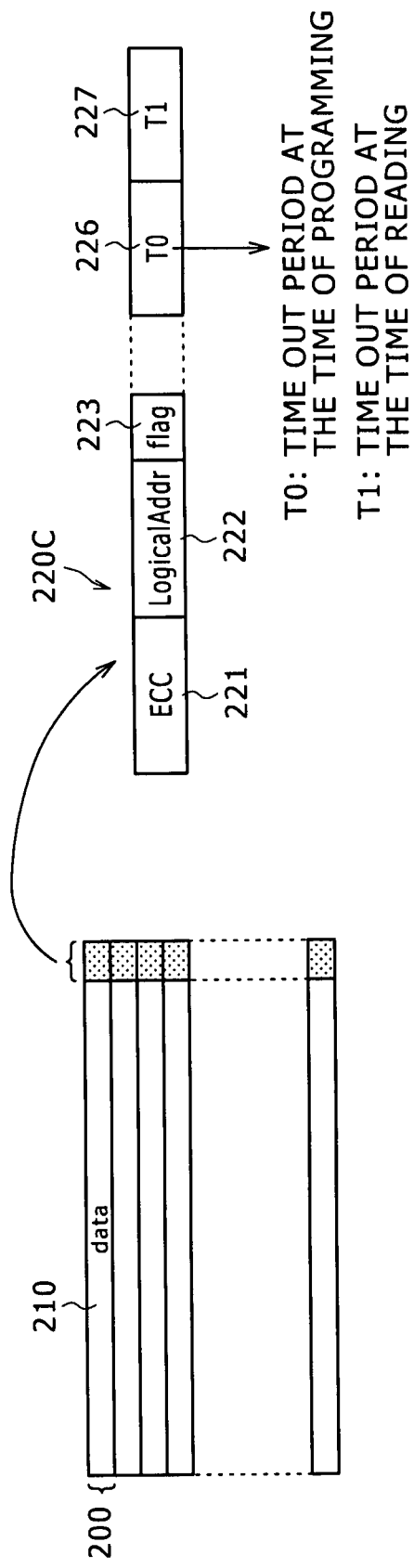

US 8,732,385 B2

NON-VOLATILE MEMORY, CONTROLLER CONTROLLING NEXT ACCESS

CROSS REFERENCES TO RELATED APPLICATIONS

The present invention contains subject matter related to Japanese Patent Application JP 2006-162275, filed in the Japan Patent Office on Jun. 12, 2006, the entire contents of which being incorporated herein by reference.

BACKGROUND OF THE INVENTION

1. Field of the Invention

The present invention relates to a non-volatile memory, such as a flash memory.

2. Description of the Related Art

Generally, in a flash memory such as a NAND flash memory, a combination of data (e.g., 512 bytes or 2 KB in size) and a redundant portion (e.g., several to hundreds of bytes in size) is treated as one page, and besides the user data, an ECC for error correction and management information are stored therein.

In some flash memories, an ECC process is performed within the flash memories, but in general, information other than the data is also read from the flash memories first and thereafter subjected to processing as the data is.

SUMMARY OF THE INVENTION

In a flash memory system in the past, the reading of the data from the flash memory involves a time for transferring the data from a cell to a buffer and a time for transferring the data from the buffer to a controller. Thus, if the controller reads the data and thereafter determines a next process based on the contents of the read data, a time when the cell within the flash memory is not used becomes long, resulting in reduced performance.

Moreover, in the case where the data is read from the flash memory first and thereafter subjected to processing, the processing in the controller becomes complicated, resulting in reduced efficiency of the controller.

An advantage of the present invention is to provide a non-volatile memory that makes it possible to reduce a load of processing by the controller and communication between the flash memory and the controller, achieve simplification and improved performance of the controller, and realize a new capability, which previously may not been possible.

According to one embodiment of the present invention, there is provided a non-volatile memory including: a memory cell array to be accessed with data including a data portion and a specific field as a unit of access; a buffer configured to hold the access-unit data read from the memory cell array or the access-unit data to be written to the memory cell array; and a control circuit configured to control access to the memory cell array in accordance with a specified address, a command, and data in the specific field of the access-unit data held in the buffer.

Preferably, the data in the specific field includes a physical address.

Preferably, the data in the specific field includes a command.

Preferably, the data in the specific field includes a sequence of either or both of commands and addresses.

Preferably, the data in the specific field includes a control parameter.

Preferably, the non-volatile memory further includes an address register, and the control circuit automatically loads the physical address in the specific field of the access-unit data held in the buffer to the address register to use the physical address with a next access command.

Preferably, the non-volatile memory further includes a command register, and the control circuit automatically loads the command in the specific field of the access-unit data held in the buffer to the command register to execute the command.

Preferably, the non-volatile memory further includes a command register and an address register, and the control circuit loads the sequence of either or both of commands and addresses in the specific field of the access-unit data held in the buffer to the command register and/or the address register sequentially to automatically read relevant data.

Preferably, the non-volatile memory further includes a command register and an address register, and the control circuit loads the sequence of either or both of commands and addresses in the specific field of the access-unit data held in the buffer to the command register and/or the address register sequentially to automatically erase a relevant block.

Preferably, the non-volatile memory further includes a command register and an address register, and the control circuit loads the sequence of either or both of commands and addresses in the specific field of the access-unit data held in the buffer to the command register and/or the address register sequentially to automatically perform programming on another location.

Preferably, the control circuit terminates access control at a desired timing in accordance with the control parameter.

Preferably, the control circuit performs access control with improved precision in accordance with the control parameter.

According to another embodiment of the present invention, there is provided a non-volatile memory including: a memory cell array to be accessed with data including a data portion and a specific field as a unit of access; a buffer configured to hold the access-unit data read from the memory cell array or the access-unit data to be written to the memory cell array; and a control circuit configured to control access to the memory cell array in accordance with a specified address, a command, and data in the specific field of the access-unit data held in the buffer, wherein the data in the specific field includes information that specifies, as data at a time of writing, an operation to be performed at a time of reading.

According to yet another embodiment of the present invention, there is provided a non-volatile memory including: a memory cell array to be accessed with data including a data portion and a specific field as a unit of access; a buffer configured to hold the access-unit data read from the memory cell array or the access-unit data to be written to the memory cell array; and a control circuit configured to control access to the memory cell array in accordance with a specified address, a command, and data in the specific field of the access-unit data held in the buffer, wherein the data in the specific field includes information that specifies, as data at a time of writing, an additional operation to be performed at the time of writing.

According to yet another embodiment of the present invention, there is provided a non-volatile memory including: a memory cell array to be accessed with data including a data portion and a specific field as a unit of access; a buffer configured to hold the access-unit data read from the memory cell array or the access-unit data to be written to the memory cell array; and a control circuit configured to control access to the memory cell array in accordance with a specified address, a command, and data in the specific field of the access-unit data held in the buffer, wherein the data in the specific field includes information that specifies, as data at a time of writing, an operation to be performed at the time of writing.

According to the above-described embodiments of the present invention, information written to the flash memory as data and information read from the flash memory as data are used also by the flash memory to control the flash memory itself. This achieves reduction in a load of processing by the controller and in communication between the flash memory and the controller. Further, since the following operation can be started in advance within the flash memory, simplification and improved performance of the controller can be achieved. Still further, since it is possible to specify, at the time of writing, an additional function to be performed at the time of reading, a novel function, which previously may not been possible, can be realized.

BRIEF DESCRIPTION OF THE DRAWINGS

FIG. 4 is a table illustrating correspondence between logical addresses and physical addresses regarding a data structure as illustrated in FIG. 3;

FIG. 15 illustrates an exemplary data structure of data used in the non-volatile memory system of FIG. 14.

DETAILED DESCRIPTION OF THE PREFERRED EMBODIMENTS

Hereinafter, embodiments of the present invention will be described with reference to the accompanying drawings.

Figure 1:
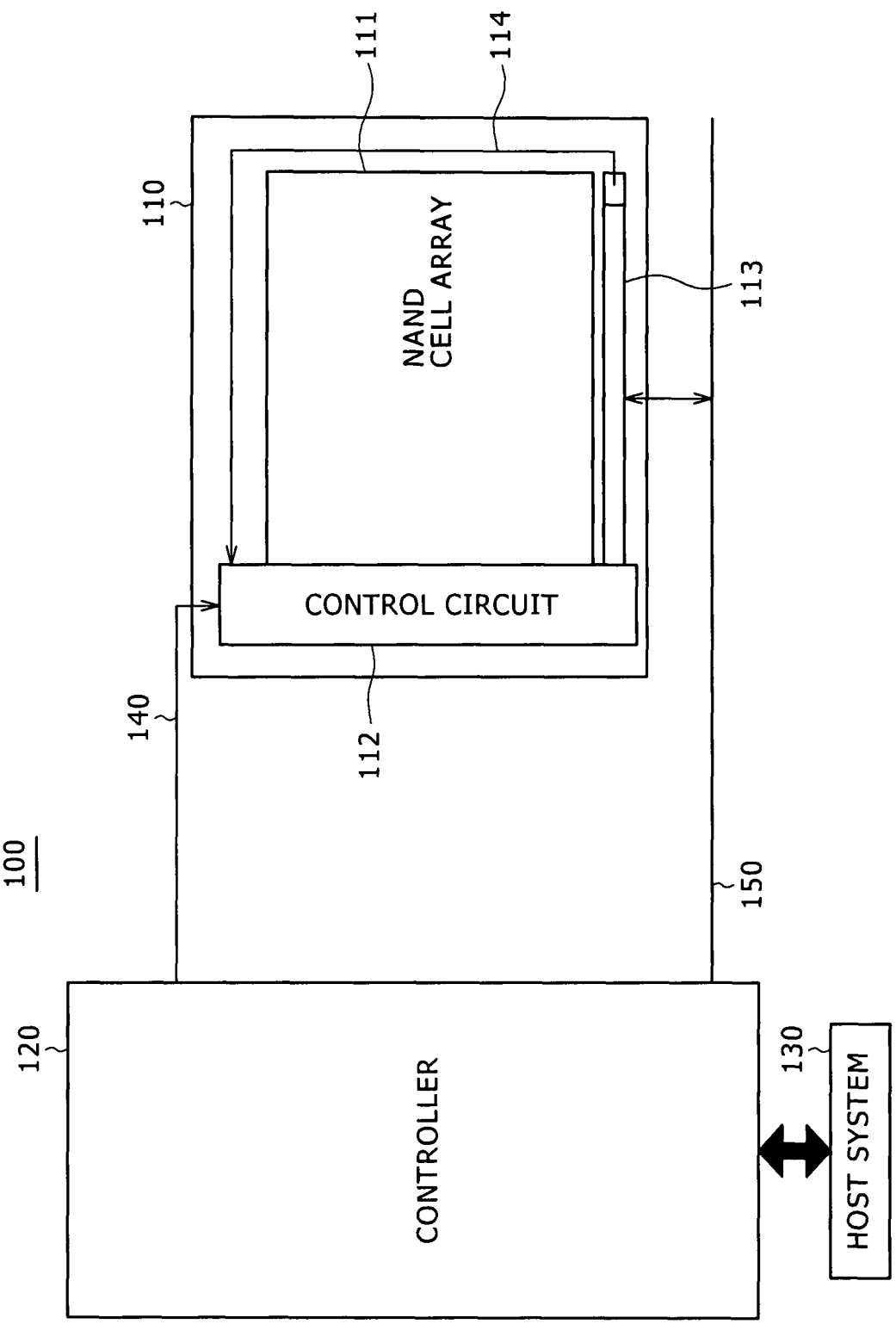
FIG. 1 is a block diagram illustrating an exemplary basic structure of a non-volatile memory system according to one embodiment of the present invention.

FIG. 1 is a block diagram illustrating an exemplary basic structure of a non-volatile memory system 100 according to one embodiment of the present invention.

In FIG. 1, the non-volatile memory system 100 includes a non-volatile memory 110 and a controller 120 for controlling access to the non-volatile memory 110 in accordance with a request from a host system 130.

In addition, the non-volatile memory system 100 includes a control line 140 and a data line 150. The control line 140 is used to transfer an address, a command, or the like from the controller 120 to the non-volatile memory 110. The data line 150 is used to transfer data read from the non-volatile memory 110 to the controller 120, and to transfer data to be written from the controller 120 to the non-volatile memory 110.

The non-volatile memory 110 includes a memory cell array 111, a control circuit 112, and a page buffer 113.

Although not shown in FIG. 1, the non-volatile memory 110 also includes an address register, an address decoder, a command decoder, and the like.

In the memory cell array 111, memory strings, e.g., NAND flash memory strings, are arranged in an array.

The control circuit 112 controls the access (e.g., reading, writing, erasing, etc.) to the memory cell array 111 based on the address and the command outputted from the controller 120 and transferred over the control line 140, and data in a specific field (e.g., data of a redundant portion) of one-page data held in the page buffer 113.

In the non-volatile memory 110 according to the present embodiment, reading and writing of data is performed on a page-by-page basis. Each page is composed of data portion (e.g., 512 bytes in size) and the redundant portion (e.g., several to hundreds of bytes in size). The access at the time of reading and writing is performed with such a page as a unit of access.

Accordingly, the page buffer 113 basically has a size corresponding to one page.

Out of the one-page data held in the page buffer 113, the data in the redundant portion is transferred to the control circuit 112 via a transfer line 114.

The non-volatile memory 110 according to the present embodiment is characterized in that non-volatile information that is normally recorded on a cell array and exchanged between a controller and the cell array as simple data is used also as an input to the control circuit 112 within the non-volatile memory (i.e., a flash memory) 110, as illustrated in FIG. 1.

A data structure according to the present embodiment will now be described below with reference to FIGS. 2, 3, and 4.

Figure 2:
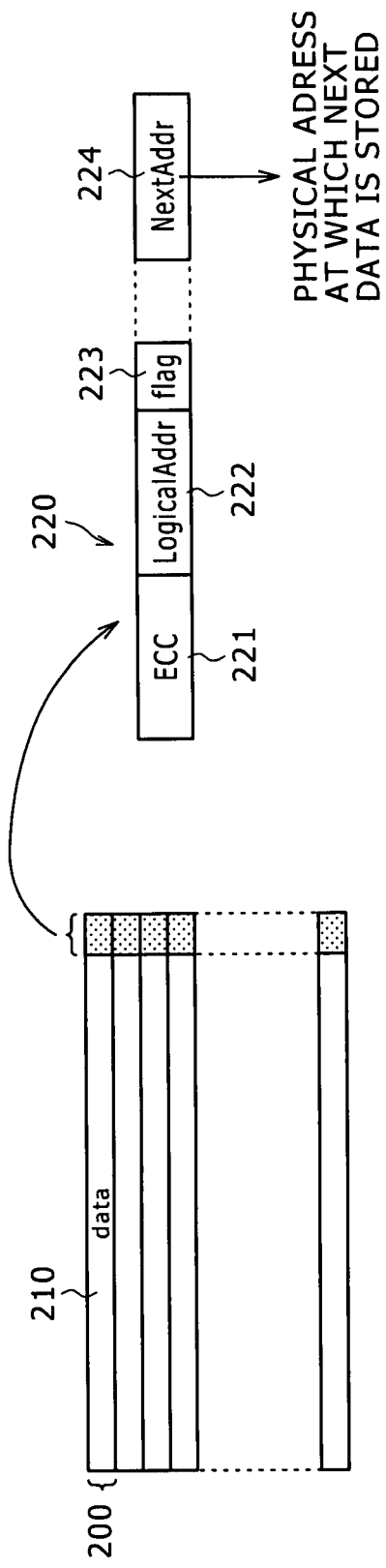
FIG. 2 illustrates a data structure of one page of a flash memory.

FIG. 2 illustrates a data structure of data of one page of the flash memory.

As illustrated in FIG. 2, one page 200 of the flash memory is composed of a data portion 210 and a redundant portion 220. The redundant portion 220 includes an ECC 221, a logical address 222, and various flags 223 for the data portion 210, and a physical address 224 of a page that stores data at a logically next address.

In short, this structure is a link list structure with one page as one element.

Figure 3:
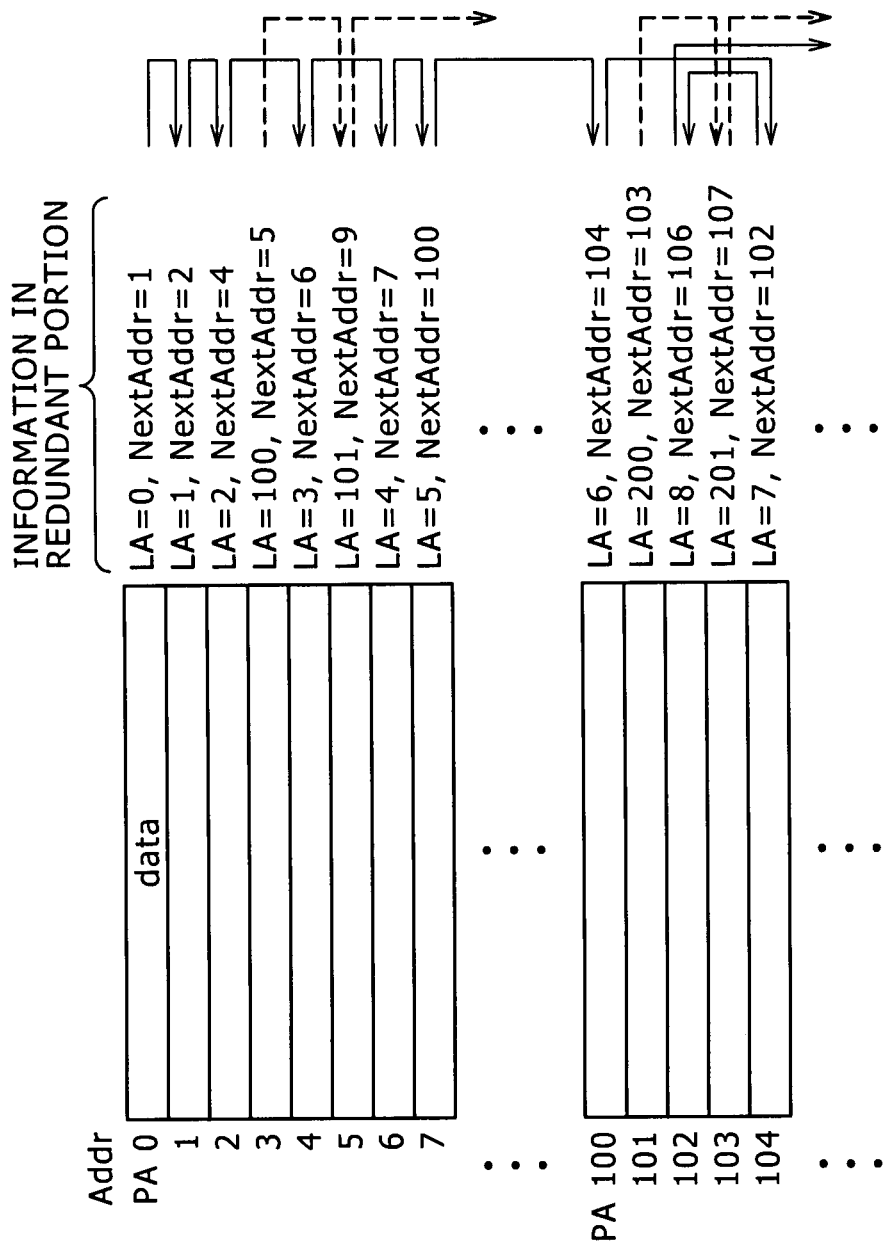
FIG. 3 illustrates relationships between pages.

FIG. 3 illustrates relationships between pages.

FIG. 4 is a table illustrating correspondence between logical addresses and physical addresses regarding a data structure as illustrated in FIG. 3.

The figures show that data located at a physical address PA0 is data corresponding to a logical address LA=0, and that data corresponding to a logically next address, i.e., a logical address LA=1, is stored at a physical address PA1.

The figures show that pieces of data beginning with the logical address LA=0 correspond to physical addresses PA0, PA1, PA2, PA4, PA6, PA7, PA100, PA104, PA102, PA106, and so on.

Further, pieces of data beginning with a logical address LA=100 correspond to physical addresses PA3, PA5, PA9, and so on. Still further, pieces of data beginning with a logical address LA=200 correspond to physical addresses PA101, PA103, PA107, and so on.

Figure 5:
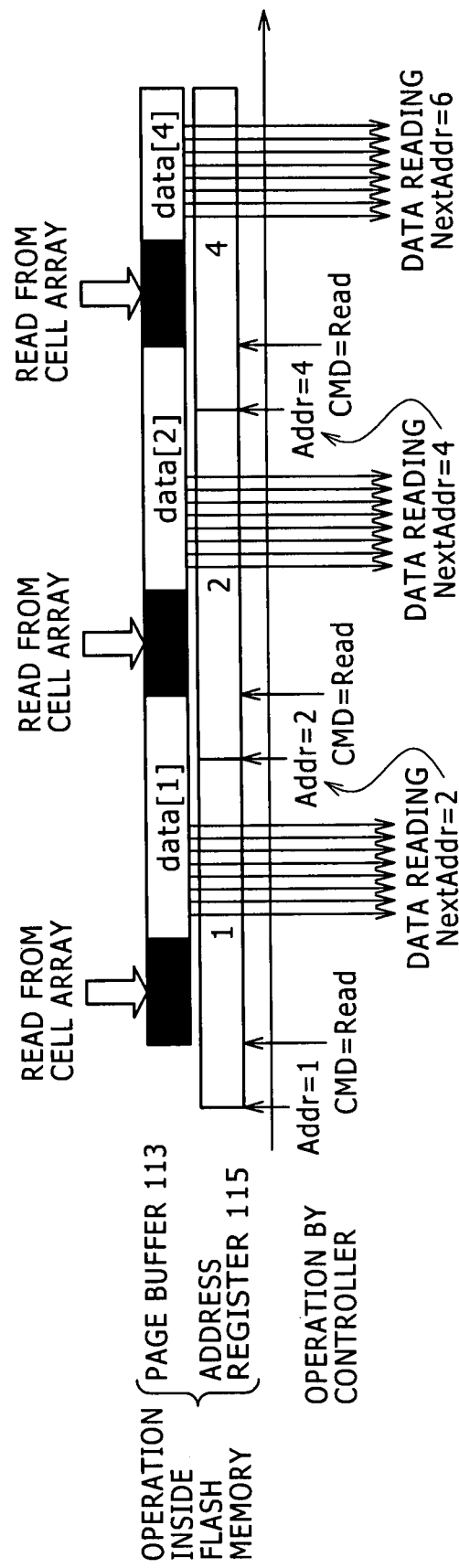
FIG. 5 illustrates an operation in a flash memory in the past, in the case where pieces of data beginning with a logical address LA=1 are read in sequential order.

FIG. 5 illustrates an operation in a flash memory in the past, in the case where the pieces of data beginning with the logical address LA=1 are read in sequential order.

When the controller inputs a physical address and a read command to the flash memory, corresponding data is read, within the flash memory, from the cell array to the page buffer. After the data at the physical address PA1 corresponding to the logical address LA=1 is completely read from the cell array to the page buffer, the controller reads the data, and at this time and not earlier, the controller recognizes that the next physical address is PA2.

Then, the controller inputs the recognized physical address PA2 and the read command to the flash memory to start reading next data.

According to this method, during a period from when the data has been read from the cell array to the page buffer until reception of the next read command, the cell array can perform no operation. Moreover, because the controller do not recognize the physical address of the data to be read next until the previous data has been read into the controller, even a flash memory capable of cache reading may not utilize its cache function.

To overcome such disadvantages, the flash memory according to the present embodiment is configured to use information written thereto and read therefrom as the data to control the flash memory itself.

Figure 6:
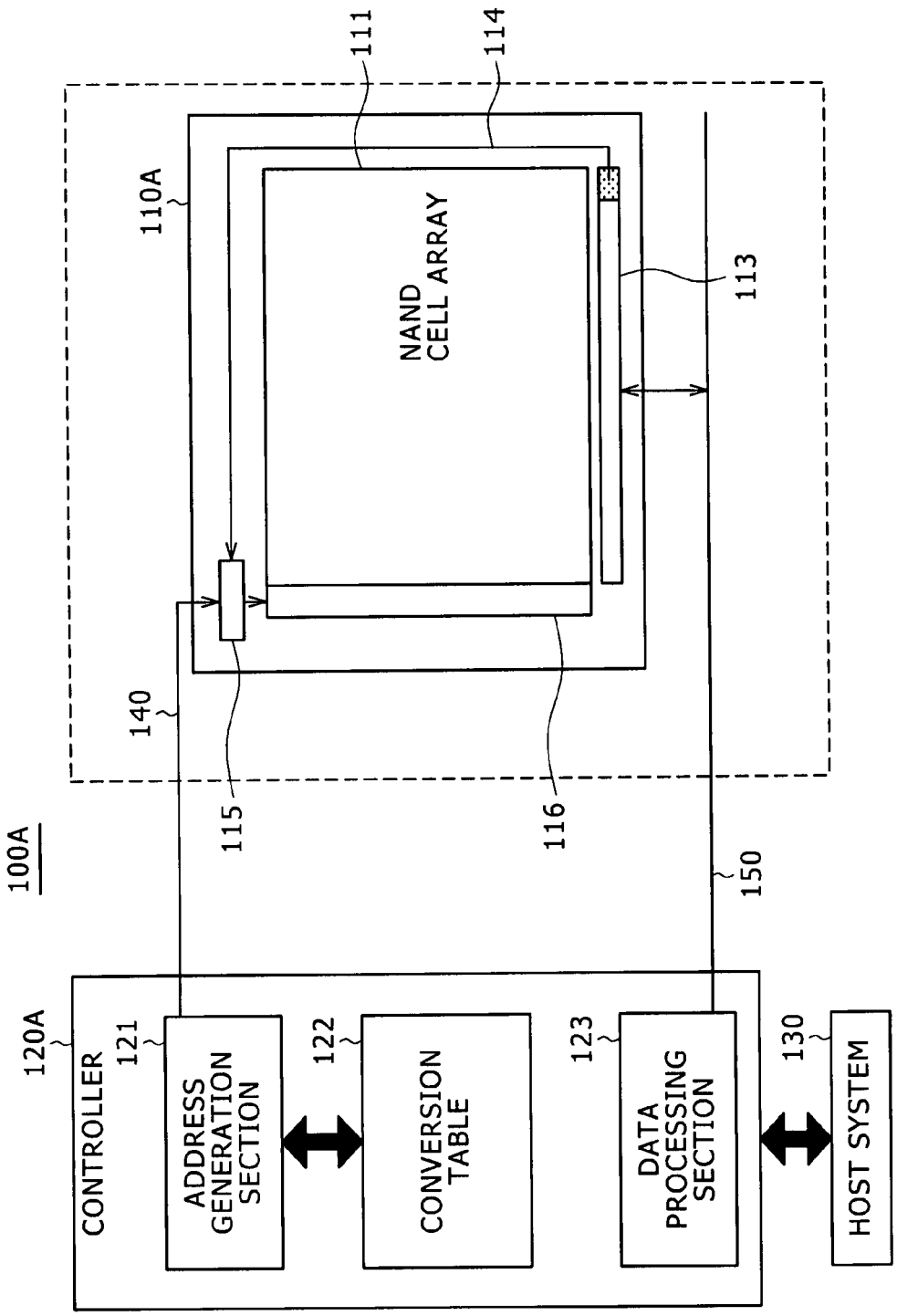
FIG. 6 illustrates a situation in which a partial field within a page buffer 113 is used for input to an address register in the present embodiment.

FIG. 6 illustrates a situation in which a partial field within the page buffer 113 is used for input to the address register in the present embodiment.

A non-volatile memory 110A, which is a flash memory, as illustrated in FIG. 6 includes an address register 115 and an address decoder 116 as parts of the control circuit.

Normally, an address generated in a controller 120A is received via the address line for use. In this embodiment, however, when the data has been read from the cell array to the page buffer 113, a part of the data is automatically loaded to the address register 115 to be used in the address decoder 116 as an address of data to be read next.

The controller 120A of a non-volatile memory system 100A as illustrated in FIG. 6 includes an address generation section 121, a logical address-physical address (logical-physical) conversion table 122, and a data processing section 123 including a memory interface (MI/F), a host interface (HI/F), a data buffer, etc.

Under control of a CPU (not shown), the controller 120A exchanges a command signal or data with the host system 130 via the host interface, and controls access to the non-volatile memory 110A via the memory interface.

The data written from the host system 130 to the non-volatile memory 110A or the data read from the non-volatile memory 110A is temporarily held in the data buffer in the data processing section 123.

Figure 7:
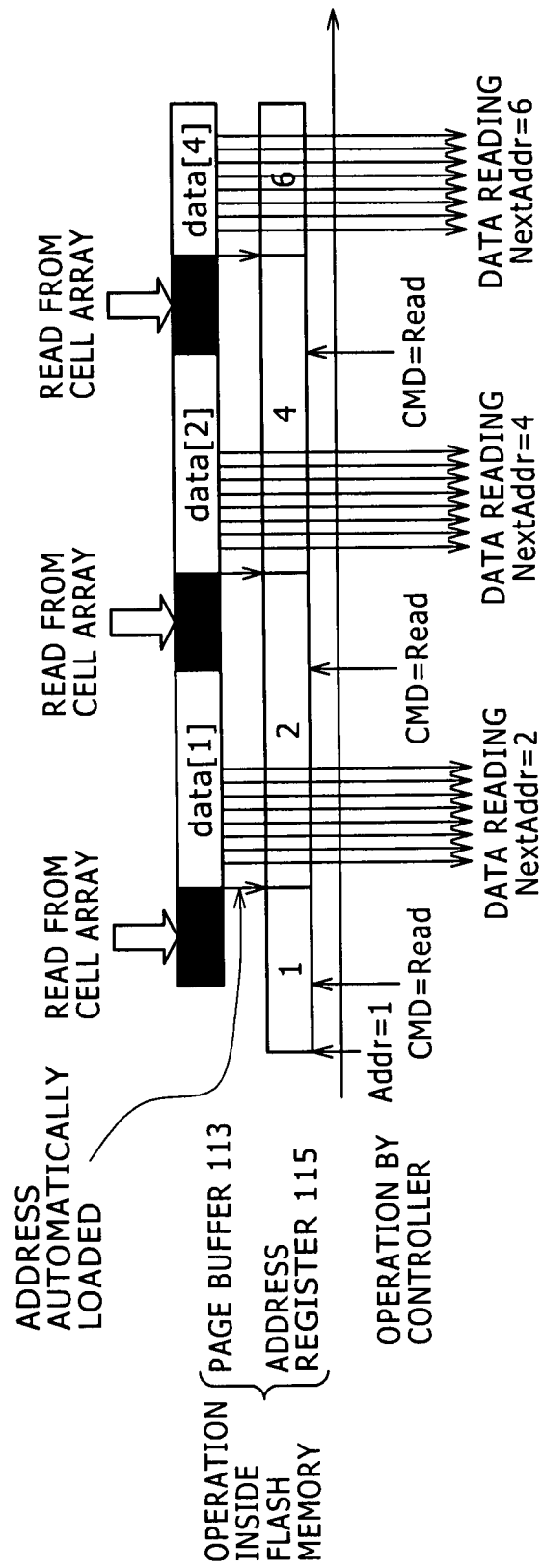
FIG. 7 illustrates an operation in a flash memory (i.e., a non-volatile memory) having a function as illustrated in FIG. 6 in the case where the pieces of data beginning with the logical address LA=1 are read in sequential order.

FIG. 7 illustrates an operation in the flash memory (i.e., the non-volatile memory) having the function as illustrated in FIG. 6 in the case where the pieces of data beginning with the logical address LA=1 are read in sequential order.

This operation is identical to the operation as illustrated in FIG. 5 until the input of the physical address PA1 corresponding to the logical address LA=1 and the first read command, but different in that when the data has been read from the memory cell array 111 to the page buffer 113, the physical address of the next data, which has just been read from the cell array 111, is automatically loaded to the address register 115.

This operation eliminates the need for the controller 120A to input, after reading the data, the address of the next data to the non-volatile memory (i.e., the flash memory) 110A, resulting in a reduced total reading time.

Figure 8:
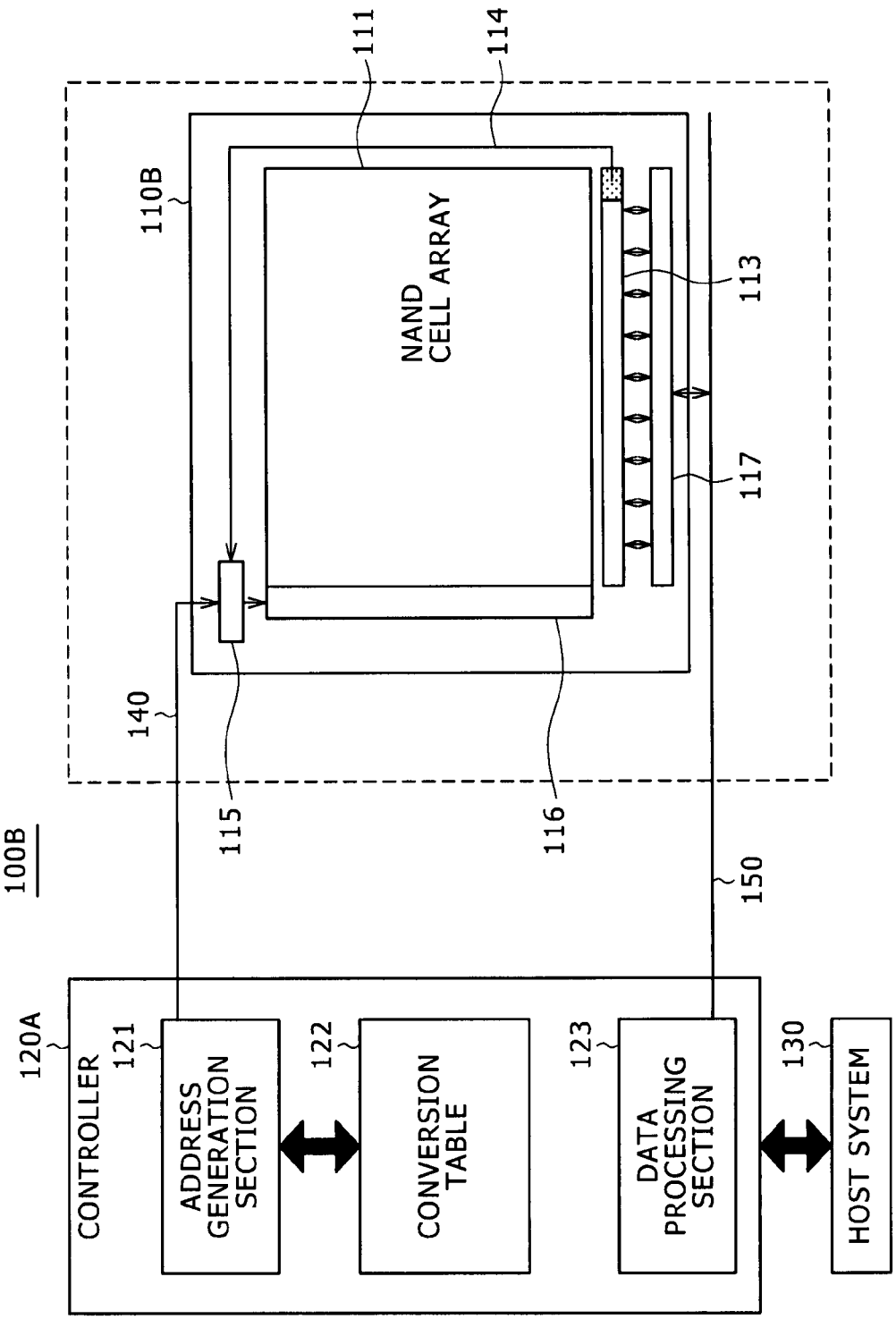
FIG. 8 illustrates a non-volatile memory system of FIG. 6 in which a non-volatile memory additionally has a cache function.

FIG. 8 illustrates another exemplary non-volatile memory system, which is different from the non-volatile memory system of FIG. 6 in that the non-volatile memory additionally has a cache function.

A non-volatile memory system 100B as illustrated in FIG. 8 includes, in place of the non-volatile memory 110A of FIG. 6, a non-volatile memory unit (i.e., a flash memory) 110B that additionally has a data cache 117.

In the non-volatile memory system 100B of FIG. 8, when the data cache 117 is used at the time of reading, the contents of the address register 115 is updated at the same time when the data is transferred from the page buffer 113 to the data cache 117.

Figure 9:
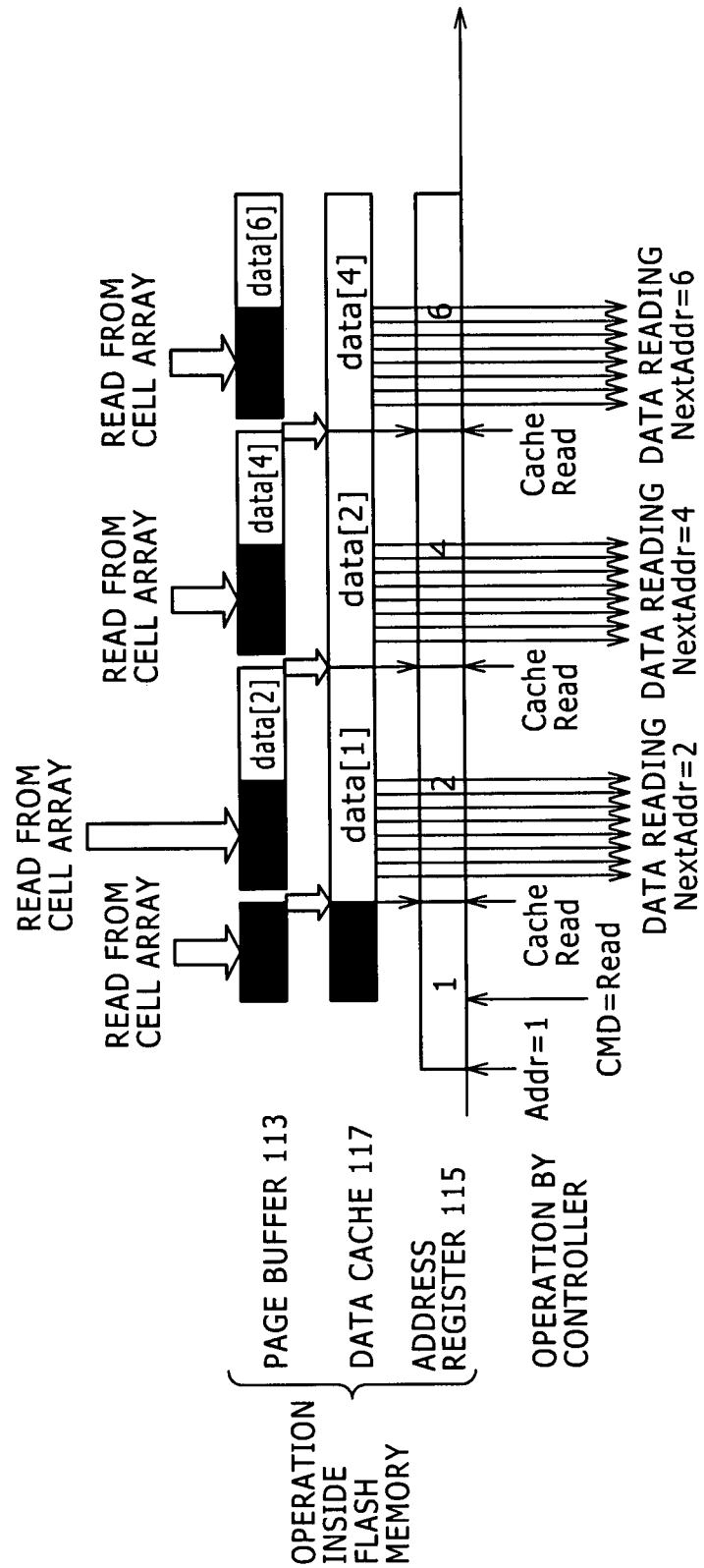
FIG. 9 illustrates an operation in the flash memory (i.e., the non-volatile memory) as illustrated in FIG. 8 in the case where the pieces of data beginning with the logical address LA=1 are read in sequential order.

FIG. 9 illustrates an operation in the flash memory (i.e., the non-volatile memory) as illustrated in FIG. 8 in the case where the pieces of data beginning with the logical address LA=1 are read in sequential order.

As in the case of a flash memory having a cache-read function in the past, the address and the read command are issued first, and after the data is completely read from the cell array 111 into the page buffer 113, a cache-read command is issued.

As a result of the issuance of the cache-read command, the contents of the page buffer 113 is transferred to the data cache 117 while, in the background, the next data is read from the cell array 111 to the page buffer 113.

Note that an address used at this time is an address that is contained in the first data and automatically loaded to the address register 115.

That is, each of the physical addresses PA of the second and subsequent pages is loaded to the address register 115 before being read to the controller 120A as part of the data, and is used for the reading of the following data from the cell array 111.

Thus, the controller 120A can achieve the reading of the pieces of data following a link list, simply by repeating the reading of data from the data cache 117 and the issuance of the cache-read command.

Figure 10:
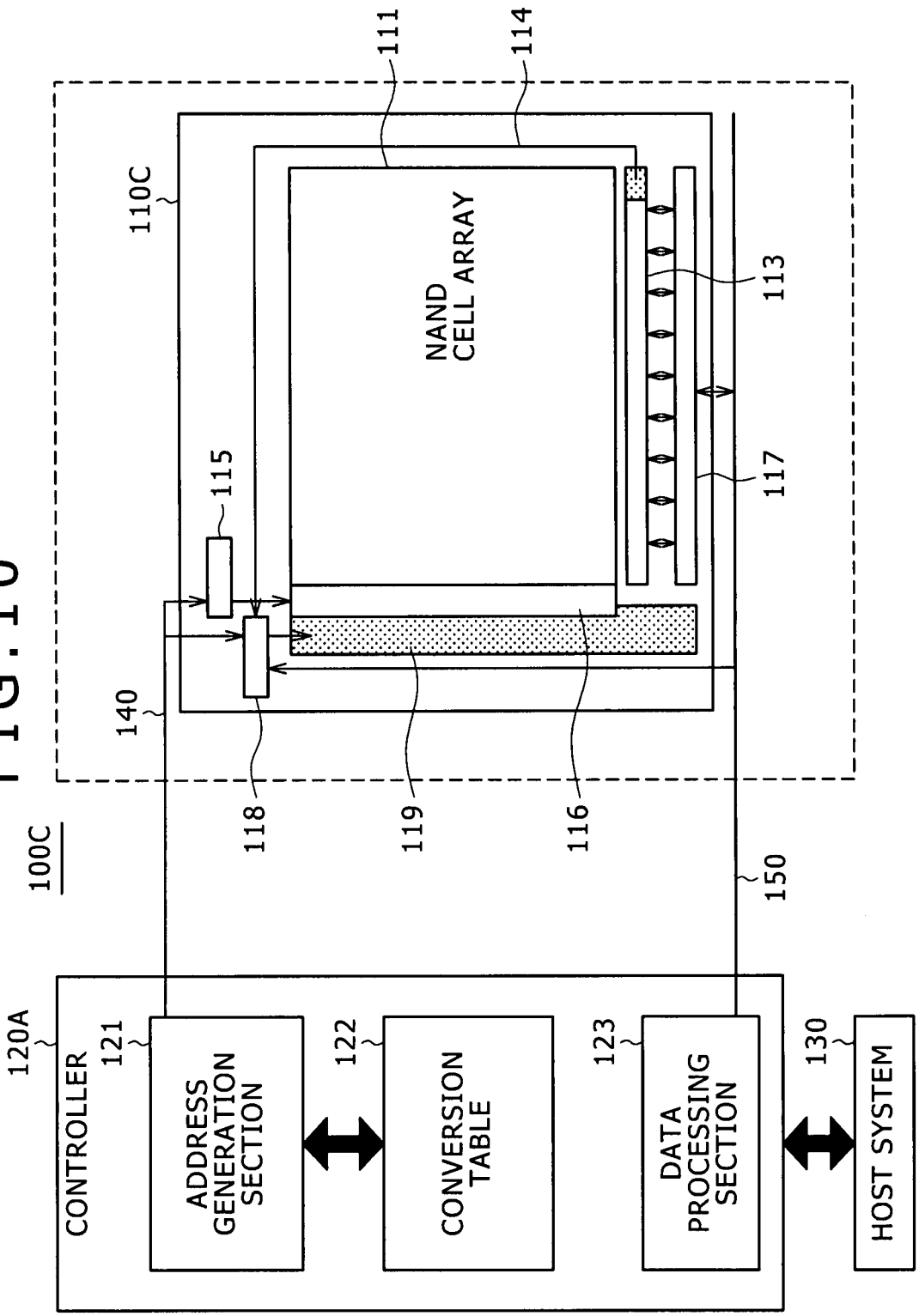
FIG. 10 illustrates the non-volatile memory system of FIG. 8 in which the non-volatile memory additionally has a command control system.

FIG. 10 illustrates another exemplary non-volatile memory system, which is different from the non-volatile memory system of FIG. 8 in that the non-volatile memory additionally has a command control system.

In a non-volatile memory system 100C as illustrated in FIG. 10, a non-volatile memory (i.e., a flash memory) 110C is additionally provided with a command register 118 and a command control circuit 119 as compared to the non-volatile memory 110B of FIG. 8.

In addition, the partial field (corresponding to the redundant portion 220) within the page buffer 113 is used for input to the command register as well.

Normally, a command code generated in the controller 120A is inputted to the command register 118 via the control line 140, the data line 150, or the like. In this embodiment, however, when the data has been read from the cell array 111 to the page buffer 113, contents of the command register 118 is updated using contents of the page buffer 113, and the command control circuit 119 executes a command therein.

Figure 11:
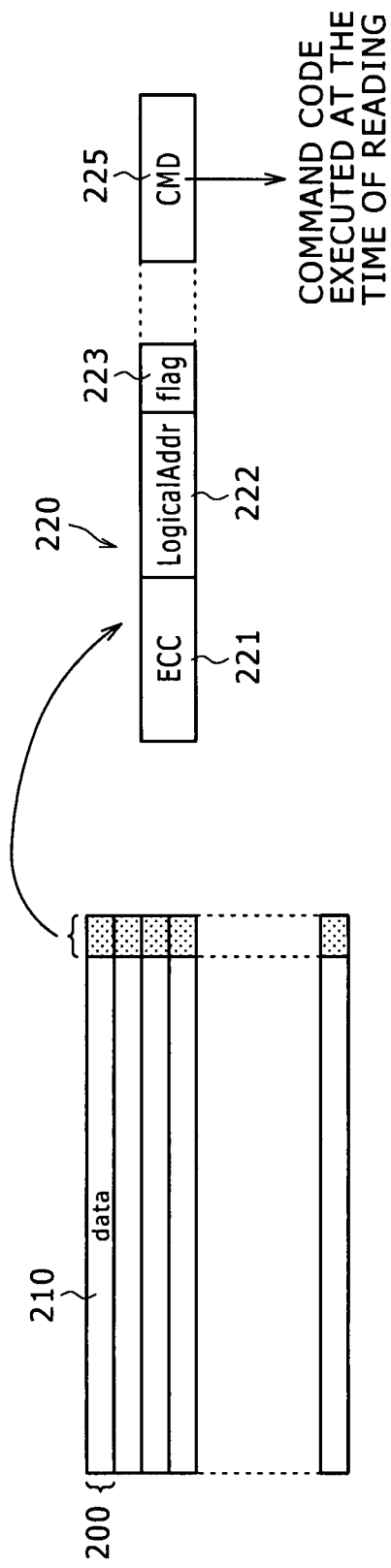
FIG. 11 illustrates an exemplary data structure of data used in the non-volatile memory system of FIG. 10.

FIG. 11 illustrates an exemplary data structure of data used in the non-volatile memory system of FIG. 10.

As illustrated in FIG. 11, each page 200 of the flash memory includes the data portion 210 and a redundant portion 220. The redundant portion includes, in addition to the ECC 221, the logical address 222, and the various flags 223 for the data portion 210, a field 225 for describing a command. The command described in this field 225 is automatically executed at the time of reading, for example.

Figure 12:
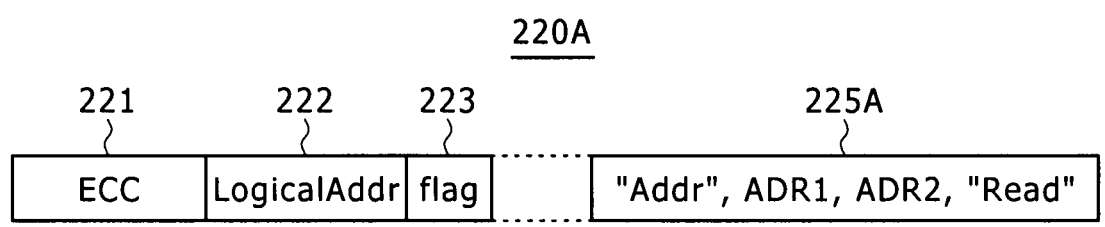
FIG. 12 illustrates an exemplary redundant portion having described therein a command for, after reading a current page, automatically reading another address.

FIG. 12 illustrates an exemplary redundant portion 220A having described therein a command for, after reading the current page, automatically reading another address.

In the case where data has been written with the redundant portion 220A as illustrated in FIG. 12, when the corresponding page is read, an address input command 225A "Addr", address 1 "ADR1", address 2 "ADR2", and a cache-read command "Read" are inputted to the control circuit 112, so that the cache reading of data at other addresses is performed automatically.

Figure 13:
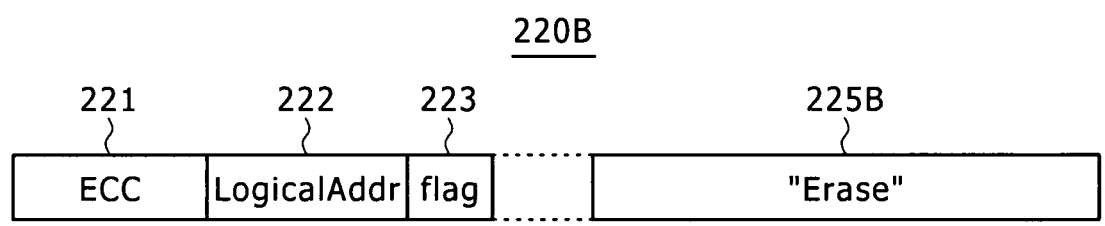
FIG. 13 illustrates an exemplary redundant portion having described therein a command for, after a current page is read, erasing a block thereof.

FIG. 13 illustrates an exemplary redundant portion 220B having described therein a command for, after the current page is read, erasing a block thereof.

In the case where data has been written with the redundant portion 220B as illustrated in FIG. 13, when the corresponding page is read, an erase command 225B "Erase" is inputted to the control circuit 112, so that the corresponding block is erased automatically.

This realizes data that can be read only once.

Figure 14:
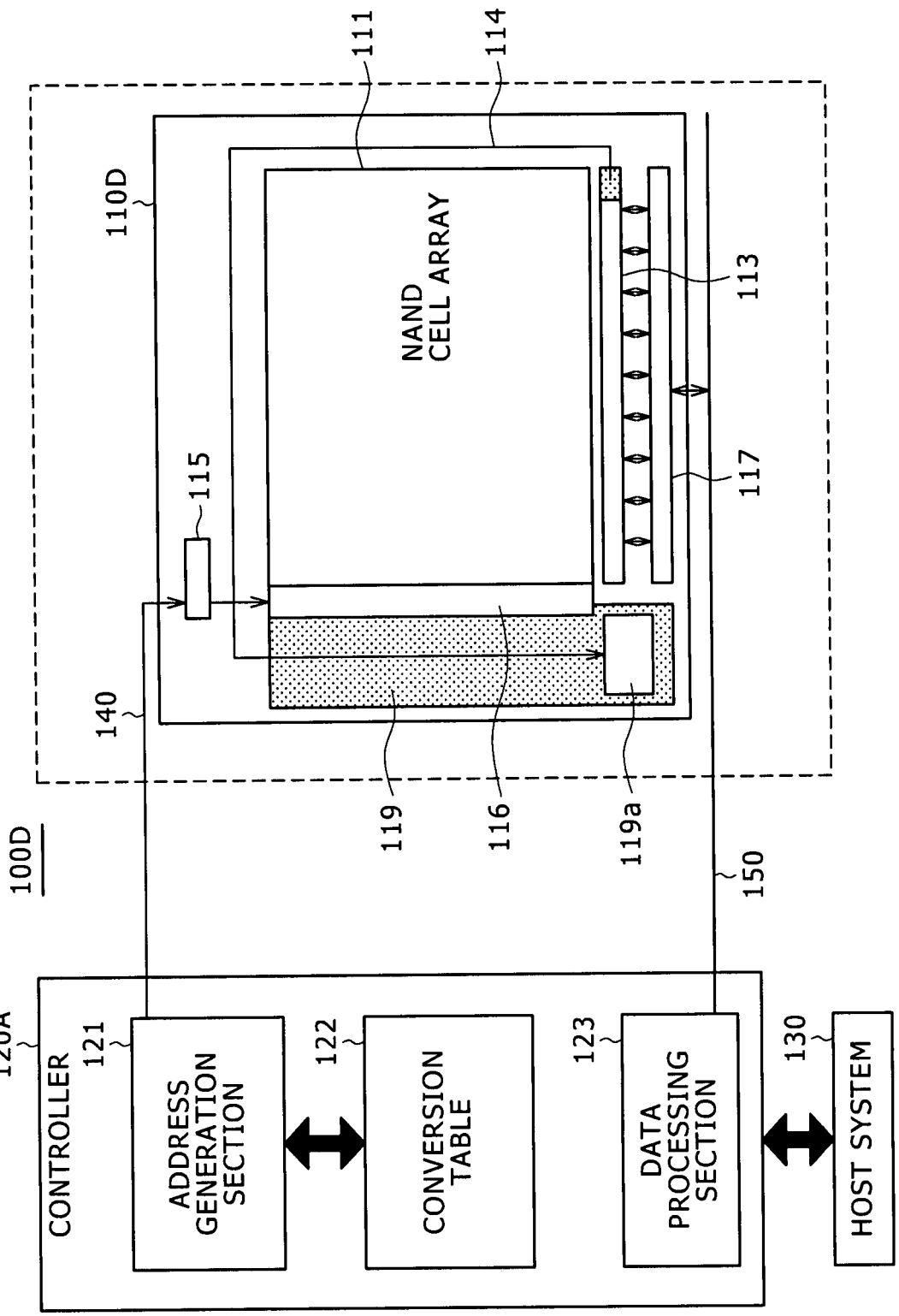
FIG. 14 illustrates the non-volatile memory system of FIG. 10 the in which a command control circuit of the non-volatile memory additionally has a time-out counter.

FIG. 14 illustrates another exemplary non-volatile memory system, including a non-volatile memory 110D, in which the command control circuit additionally has a time-out counter as compared to the non-volatile memory of FIG. 10.

In this exemplary non-volatile memory system, data in the partial field within the page buffer 113 (i.e., the data in the redundant portion) is used for input to a time-out counter 119a for detecting a time-out at the time of reading or programming, instead of for input to the command register.

Some flash memories in the past have a function of diagnosing a situation where a reading or programming operation is not completed within a predetermined period as an error. A non-volatile memory system 100D as illustrated in FIG. 14 makes it possible to specify such a time-out period in a part of data to be written or read.

FIG. 15 illustrates an exemplary data structure of data used in the non-volatile memory system of FIG. 14.

In the data structure as illustrated in FIG. 15, a redundant portion 220C includes a field 226 for describing a time-out period T0 at the time of programming and a field 227 for describing a time-out period T1 at the time of reading. Values described in these fields can be used as time-out periods at the time of programming and at the time of reading, for example. Thus, placing arbitrary time constraints becomes possible.

As described above, according to the present embodiment, reforming of a control structure within the flash memory in the non-volatile memory system achieves reduction in an amount of exchange of control between the flash memory and the controller and reduction in the load on the controller, thereby improving the speed of processing.

Moreover, it becomes possible to start, before data is read into the controller, the next operation that normally cannot be started before the data is read into the controller. Thus, considerable improvement in throughput is achieved.

Still further, it becomes possible to specify, at the time of programming, an operation to be performed automatically at the time of reading. This makes it possible to generate and manage special data, such as data that can be read only once.

Still further, it becomes possible to vary the operation of the flash memory at the time of reading, writing, or the like depending on the contents of the data. This makes it possible to manage each data in an appropriate manner.

It should be understood by those skilled in the art that various modifications, combinations, sub-combinations and alterations may occur depending on designs and other factors insofar as they are within the scope of the appended claims or the equivalents thereof.

What is claimed is:

1. A non-volatile memory, comprising:
a memory cell array configured to store a plurality of pages of data, respective pages of data including a data portion and a redundant portion, the redundant portion including a respective logical address and a respective physical address corresponding to a next logical address;
a page buffer configured to store a respective page of data;
a control circuit including an address register; and
a data cache,
wherein the control circuit is configured transfer a first page of data from the memory cell array to the page buffer with a first access command, configured to output a first physical address directly to the address register before reading out the first page of data, configured to transfer the first page of data from the page buffer to the data cache, configured to transfer a second page of data from the memory cell array to the page buffer while the first page of data is read out from the data cache, and further configured to output the first physical address directly to the address register at the same time that the first page of data is transferred from the page buffer to the data cache.

2. The non-volatile memory according to claim 1, wherein the control circuit is configured to output the first physical address directly to the address register immediately after the first page of data has been written to the page buffer.

3. The non-volatile memory according to claim 1, wherein the control circuit is further configured to transfer a second page of data from the memory cell array to the page buffer with a second access command, the second page of data corresponding to the first physical address, and further configured to output a second physical address to the address register before reading out the second page of data.

4. The non-volatile memory according to claim 3, wherein the control circuit is configured to issue the second access command after reading out the first page of data.

5. A non-volatile memory comprising:
a memory cell array configured to store a plurality of pages of data, respective pages of data including a data portion and a redundant portion, the redundant portion including a respective command code;
a page buffer configured to store a respective page of data;
a control circuit including an command register; and
a data cache,
wherein the control circuit is configured transfer a first page of data from the memory cell array to the page buffer with a first access command, configured to output a first command code directly to the command register before reading out the first page of data, configured to transfer the first page of data from the page buffer to the data cache, configured to transfer a second page of data from the memory cell array to the page buffer while the first page of data is read out from the data cache, and further configured to output the first command code directly to the command register at the same time that the first page of data is transferred from the page buffer to the data cache.

6. The non-volatile memory according to claim 5, wherein the control circuit is configured to output the first command code directly to the command register immediately after the first page of data has been written to the page buffer.

7. The non-volatile memory according to claim 5, wherein the command register is configured to execute a command corresponding to the first command code immediately after the first command code is output to the command register.

8. A non-volatile memory comprising:
   a memory cell array configured to store a plurality of pages of data, respective pages of data including a data portion and a redundant portion, the redundant portion including a respective logical address, a respective physical address corresponding to a next logical address, and a command code;
   a page buffer configured to store a respective page of data;
   a control circuit including an address register and a command register; and
   a data cache,
   wherein the control circuit is configured transfer a first page of data from the memory cell array to the page buffer with a first access command, configured to output a first physical address directly to the address register before reading out the first page of data and to output a first command code directly to the command register before reading out the first page of data, configured to transfer the first page of data from the page buffer to the data cache, configured to transfer a second page of data from the memory cell array to the page buffer while the first page of data is read out from the data cache, and further configured to output the first physical address directly to the address register at the same time that the first page of data is transferred from the page buffer to the data cache.

9. The non-volatile memory according to claim 8, wherein the control circuit is configured to output the first physical address directly to the address register immediately after the first page of data has been written to the page buffer.

10. The non-volatile memory according to claim 8, wherein the command register is configured to execute a command corresponding to the first command code immediately after the first command code is output to the command register.

11. The non-volatile memory according to claim 10, wherein the command corresponding to the first command code is to transfer a second page of data from the memory cell array to the page buffer, the second page of data corresponding to the first physical address.

* * * * *

UNITED STATES PATENT AND TRADEMARK OFFICE
CERTIFICATE OF CORRECTION

| | | |
|---|---|---|
| PATENT NO. | : 8,732,385 B2 | Page 1 of 1 |
| APPLICATION NO. | : 11/797954 | |
| DATED | : May 20, 2014 | |
| INVENTOR(S) | : Takeshi Ishimoto | |

It is certified that error appears in the above-identified patent and that said Letters Patent is hereby corrected as shown below:

On Title Page 2, Column 1, under Foreign Patent Documents, line 3,

"2006-163302" should be listed as -- 2000-163302 --.

Signed and Sealed this
Sixteenth Day of September, 2014

Michelle K. Lee
*Deputy Director of the United States Patent and Trademark Office*